(12) United States Patent
Park (10) Patent No.: US 7,709,372 B2
(45) Date of Patent: *May 4, 2010

(54) SEMICONDUCTOR DEVICE AND METHOD FOR MANUFACTURING THE SAME

(75) Inventor: Keun Soo Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 323 days.

This patent is subject to a terminal disclaimer.

(21) Appl. No.: 11/641,037

(22) Filed: Dec. 19, 2006

(65) Prior Publication Data

US 2007/0148960 A1 Jun. 28, 2007

(30) Foreign Application Priority Data

Dec. 28, 2005 (KR) .................. 10-2005-0132011

(51) Int. Cl.
*H01L 21/4763* (2006.01)
(52) U.S. Cl. .................. 438/630; 438/627; 438/649; 438/657; 257/E21.199
(58) Field of Classification Search .................. 438/618, 438/622, 627, 629, 630, 633, 643, 649, 652, 438/653, 657; 257/E21.199
See application file for complete search history.

(56) References Cited

U.S. PATENT DOCUMENTS

| 5,972,786 A | * | 10/1999 | Hoshino et al. | ............. 438/627 |
| 7,388,290 B2 | * | 6/2008 | Clampitt | ..................... 257/751 |
| 2007/0145594 A1 | * | 6/2007 | Park | .......................... 257/763 |

* cited by examiner

*Primary Examiner*—Ha Tran T Nguyen
*Assistant Examiner*—Daniel Whalen
(74) *Attorney, Agent, or Firm*—Lowe Hauptman Ham & Berner, LLP (57) ABSTRACT

A method of manufacturing a metal wiring in a semiconductor device includes: forming a via hole by selectively etching an interlayer insulating layer formed on a first metal layer; sequentially forming a first barrier metal layer and a second metal layer on the interlayer insulating layer; etching the first barrier metal layer and the second metal layer in the via hole to a predetermined depth together with selectively etching a surface of the second metal layer; forming a silicon layer on the first barrier metal and the second metal to a predetermined height; forming a second barrier metal layer on the interlayer insulating layer; forming a third metal layer on the second barrier metal layer; and forming a second barrier metal pattern and a third metal layer pattern by patterning the second barrier metal layer and the third metal layer.

7 Claims, 9 Drawing Sheets

SEMICONDUCTOR DEVICE AND METHOD FOR MANUFACTURING THE SAME

FIELD OF THE INVENTION

The present invention relates to a semiconductor device and a method for manufacturing the same. More particularly, the present invention relates to a method for manufacturing a metal wiring in a semiconductor device.

BACKGROUND OF THE INVENTION

As it is well known, a metal wiring is required to apply an electric signal to a semiconductor device, and a metal wiring process having a multi-layer metal structure of at least two metals is currently used for manufacturing a highly integrated semiconductor device. Such a conventional metal wiring process is described in detail with reference to FIGS. 1A to 1G.

FIGS. 1A to 1G are cross-section views showing a method for manufacturing a conventional semiconductor device.

Figure 1A:
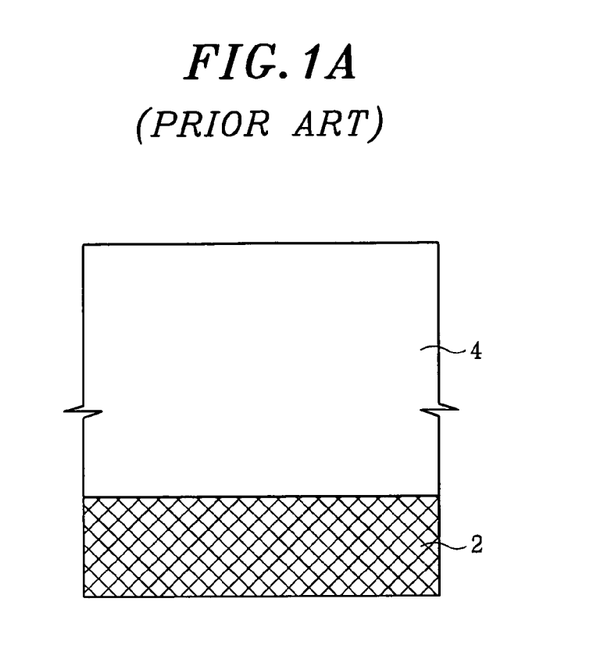
FIGS. 1A to 1G are cross-section views showing a method for manufacturing a semiconductor device according to a prior art.

At first, referring to FIG. 1A, a first metal layer 2 is formed by performing a coating process such as a spin coating to apply an electric signal to a semiconductor device (not shown) formed on a semiconductor substrate. Thereafter, an interlayer insulating layer 4 is formed on the first metal layer 2, and the interlayer insulating layer 4 is planarized by applying a chemical mechanical polishing (CMP) process to the formed interlayer insulating layer 4.

Figure 1B:
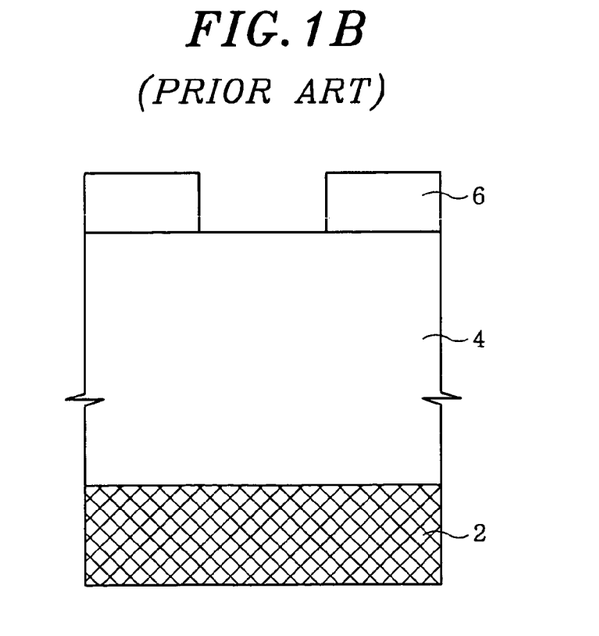
Figure 1C:
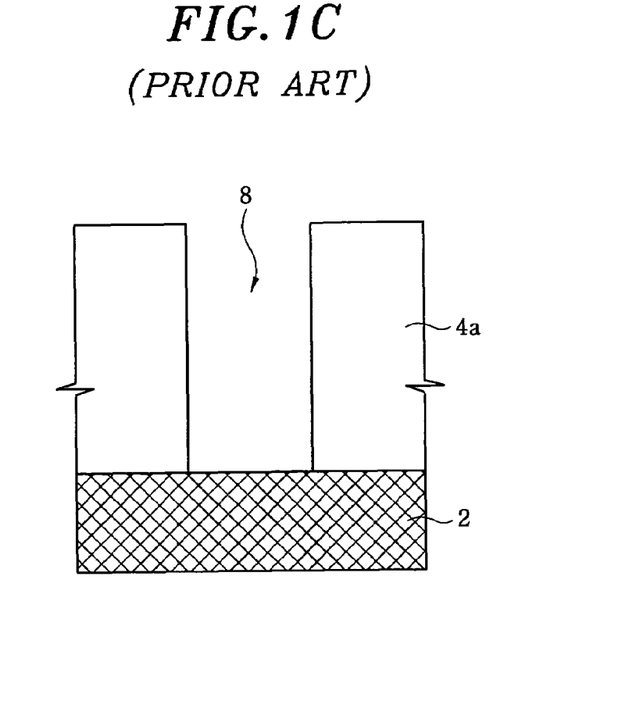

In the next step, as shown in FIG. 1B, a photoresist layer is coated on a top of the interlayer insulating layer 4, and a first photoresist layer pattern 6 is formed by selectively removing a portion of the photoresist layer to a predetermined depth by using a pattern mask. A via hole 8, as shown in FIG. 1C, is then formed by etching the interlayer insulating layer 4 using the formed first photoresist layer pattern 6 as a mask. In sequence, the remained first photoresist layer pattern 6 is removed by performing a streaming process.

Figure 1D:
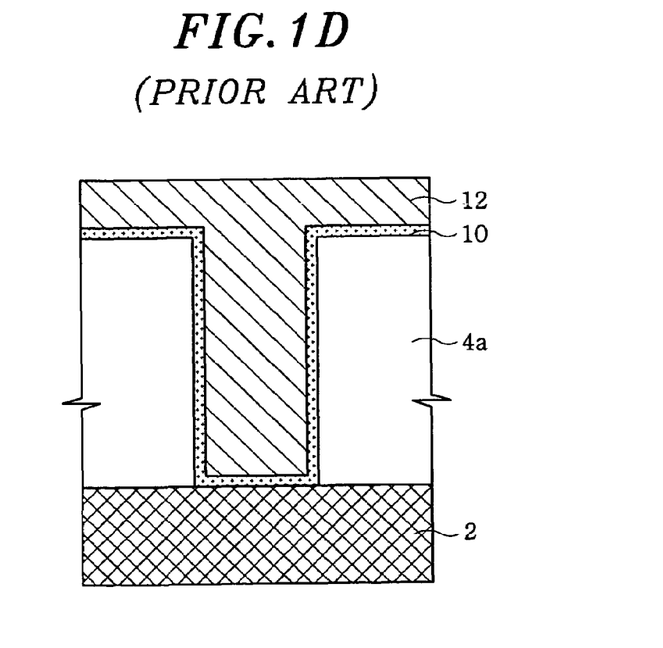

In the following step, as shown in FIG. 1D, a barrier metal 10 is deposited on top of the interlayer insulating layer 4a having the via hole 8 formed thereon and the first metal layer 2. In addition, a second metal layer 12 is coated on a top of the deposited barrier metal 10 by performing sputtering processes.

Figure 1E:
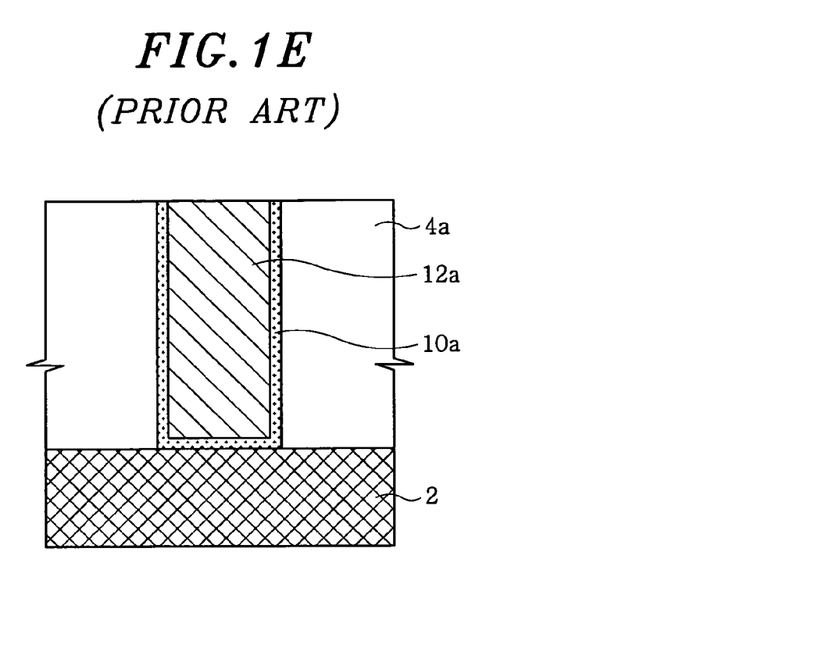

Sequentially, by applying, as shown in FIG. 1E, a CMP or an etch-back process to the deposited barrier metal 10 and the coated second metal layer 12, the deposited barrier metal 10 and the coated second metal layer 12 are planarized so as to form a barrier metal 10a and a second metal 12a.

Figure 1F:
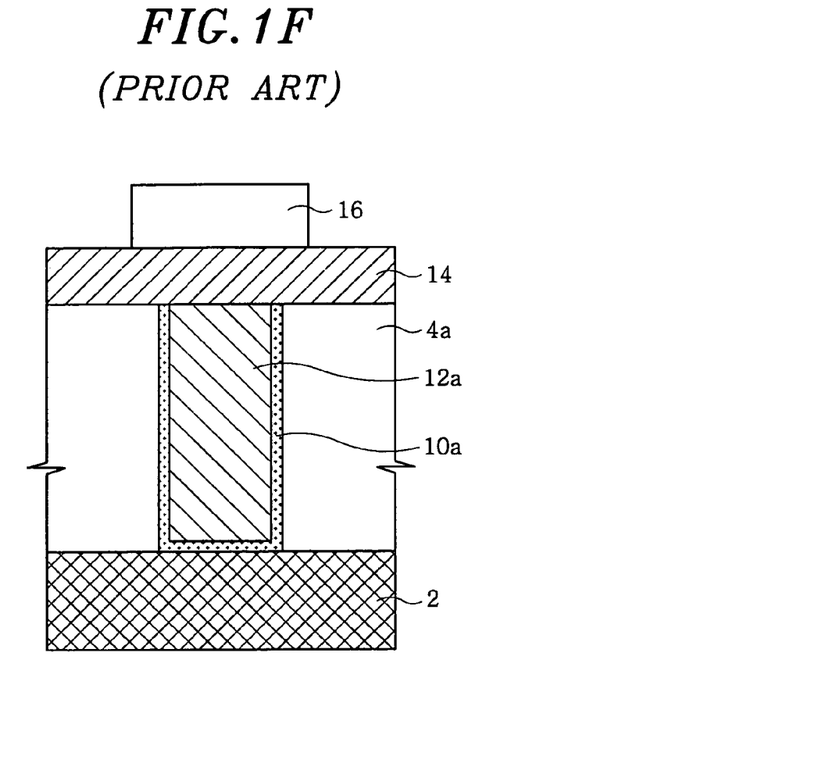

Thereafter, by performing a sputtering process on the surfaces comprising the tops of the interlayer insulating layer 4a, the barrier metal 10a and the second metal 12a, as shown in FIG. 1F, a third metal layer 14 is formed. A photoresist layer is then coated on a top of the third metal layer 14 and a second photoresist layer pattern 16 is formed by patterning the photoresist layer.

Figure 1G:
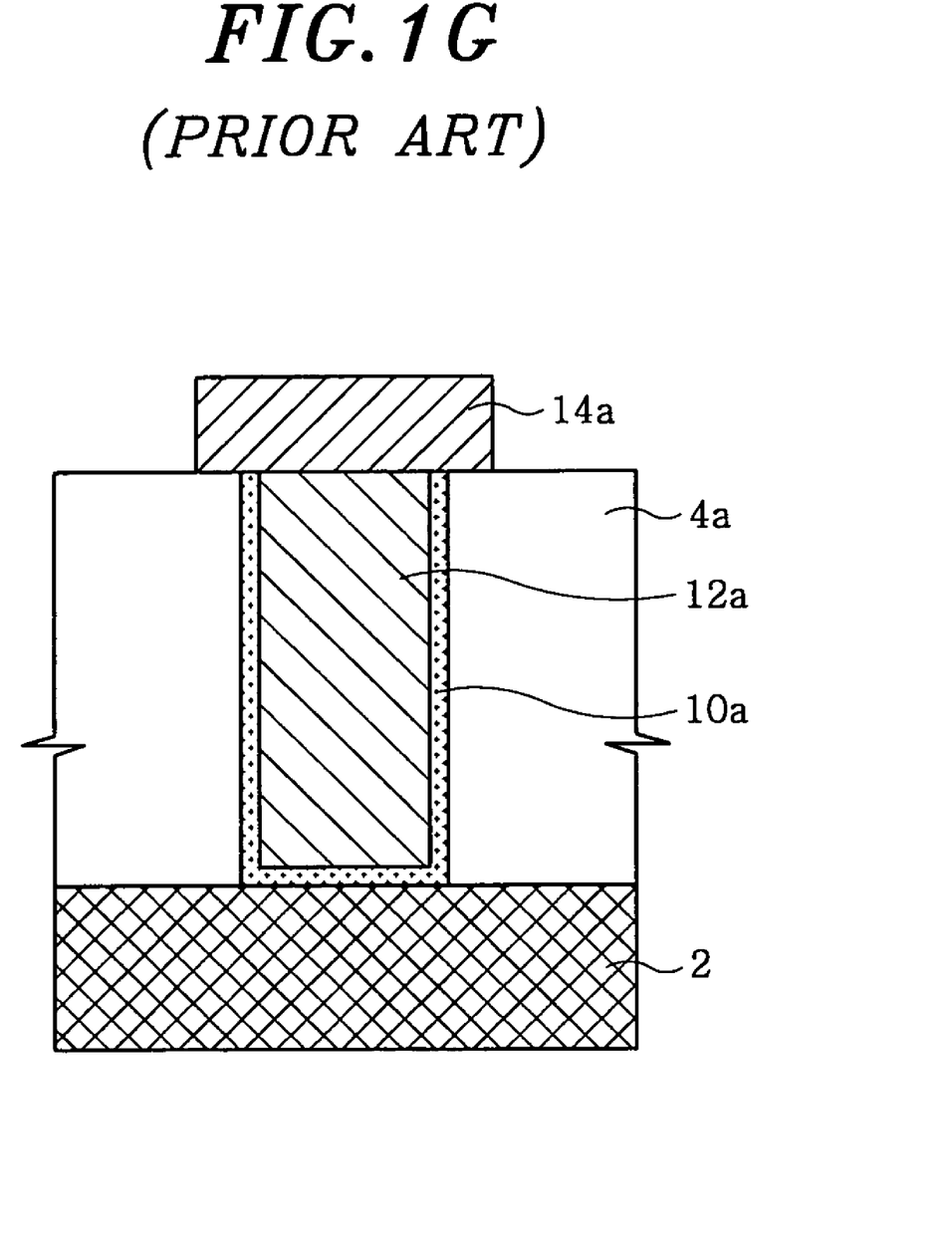

Finally, a third metal layer pattern 14a is formed by dry etching the third metal layer 14, wherein the second photoresist layer pattern 16 is utilized as a mask, as shown in FIG. 1G. Accordingly, the first metal layer 2 and the third metal layer pattern 14a are electrically connected by the barrier metal 10a and the second metal 12a.

However, a method for forming a metal wiring of a conventional semiconductor device described above is formed by a previously defined process, and therefore, more fabrication installations are required for foundry companies to manufacture devices capable of operating at a voltage desired by a customer.

Furthermore, because a metal layer is formed in a multi-layer structure to form a metal wiring of the semiconductor device useful at a high voltage, there is an increased probability of generating an error as the number of metal layers increases.

SUMMARY OF THE INVENTION

It is, therefore, an object of the present invention to provide a semiconductor device having an insulating layer formed in an inner space of a via hole in order to manufacture a metal wire and a method for manufacturing the same.

In accordance with a preferred embodiment of the present invention, there is provided a semiconductor device, including: a first metal layer formed on a semiconductor substrate; an interlayer insulating layer formed on the first metal layer, wherein a via hole is formed in the interlayer insulating layer; a second metal layer filled into the via hole at a first predetermined height, wherein a surface of the second metal layer is selectively etched; a first barrier metal formed between an inner wall of the via hole and the second metal and between the first metal layer and the second metal; a silicon layer formed on the second metal at a second predetermined height; a second barrier metal pattern formed on the interlayer insulating layer and the silicon layer; and a third metal layer pattern formed on the second barrier metal.

In accordance with another preferred embodiment of the present invention, there is provided a method for manufacturing a semiconductor device, the method including the steps of: forming a via hole by selectively etching an interlayer insulating layer formed on a first metal layer; sequentially forming a first barrier metal layer and a second metal layer on the interlayer insulating layer formed therein the via hole and performing a planarizing process; etching the first barrier metal layer and the second metal layer in the via hole to a predetermined depth together with selectively etching a surface of the second metal layer, simultaneously, thereby obtaining a first barrier metal and a second metal; forming a silicon layer on the first barrier metal and the second metal to a predetermined height; forming a second barrier metal layer on the interlayer insulating layer including the via hole; forming a third metal layer on the second barrier metal layer; and forming a second barrier metal pattern and a third metal layer pattern by patterning the second barrier metal layer and the third metal layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

FIG. 2A to FIG. 2I are process flow charts sequentially depicting major processes to form a metal wire on a semiconductor substrate in accordance with the present invention.

Figure 2A:
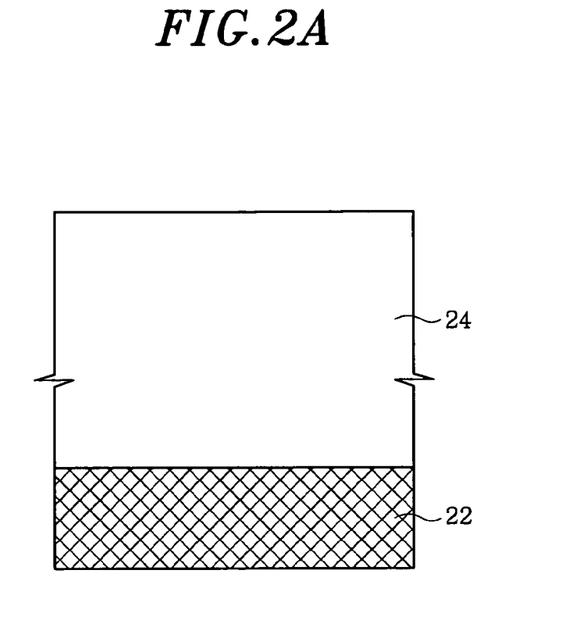
FIGS. 2A to 2I are cross-section views illustrating a method for manufacturing a semiconductor device in accordance with the present invention.

At first, referring to FIG. 2A, a first metal layer 22 is formed on a semiconductor substrate (not shown) by implementing a coating process such as a spin coating on the semiconductor substrate to apply an electric signal to a semiconductor device. An interlayer insulating layer 24 is formed on a top of the formed first metal layer 22 and the interlayer insulating layer 24 is planarized by applying a chemical mechanical polishing (CMP) process to the formed interlayer insulating layer 24.

Figure 2B:
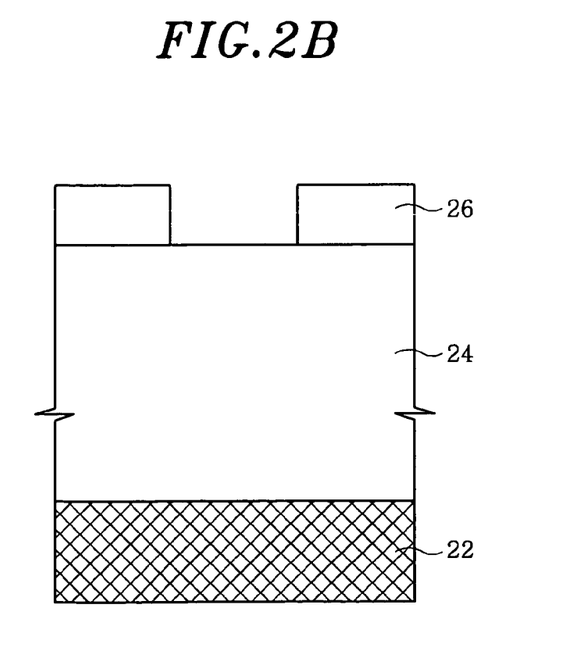

Thereafter, a photoresist layer is coated on a top of the planarized interlayer insulating layer 24 and is selectively removed by performing a photolithography process and a developing process using a reticle having a predetermined design of an arbitrary pattern to be intended. As shown in FIG. 2B, the photoresist layer thereby forms a photoresist layer pattern 26 to selectively expose a portion of the top of the interlayer insulating layer 24.

Figure 2C:
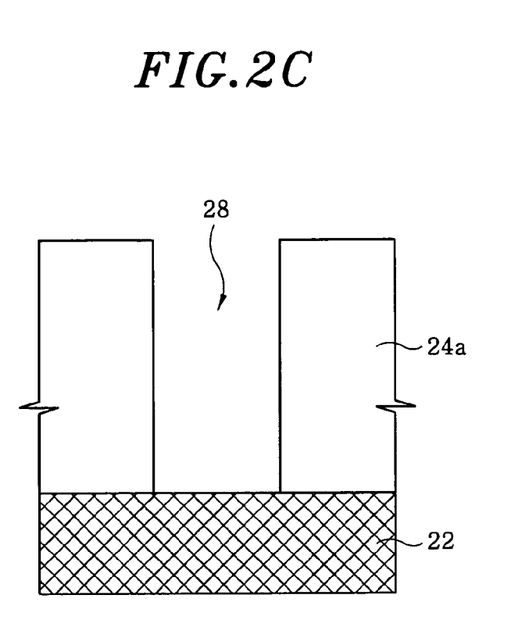

In the following step, a via hole 28 is formed by etching the interlayer insulating layer 24, wherein the photoresist layer pattern 26 is utilized as a mask, as shown in FIG. 2C. The remaining photoresist layer pattern 26 is removed by performing a streaming process, to thereby form an interlayer insulating layer pattern 24a having the via hole 28 therein.

Figure 2D:
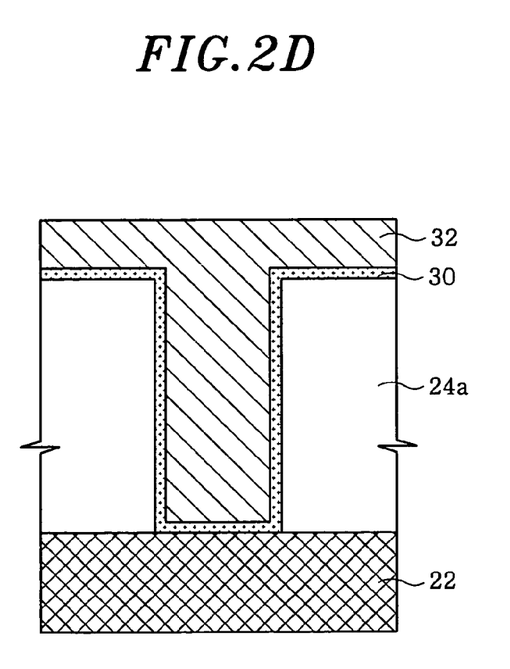

In the next step, by performing a sputtering process on the first metal layer 22 and the interlayer insulating layer pattern 24a formed thereon the via hole 28, as shown in FIG. 2D, a first barrier metal layer 30 is deposited, and a second metal layer 32 is coated on the deposited first barrier metal layer 30. In accordance with the preferred embodiment, the first barrier metal layer 30 is made of titanium and the second metal layer 32 is made of tungsten.

Figure 2E:
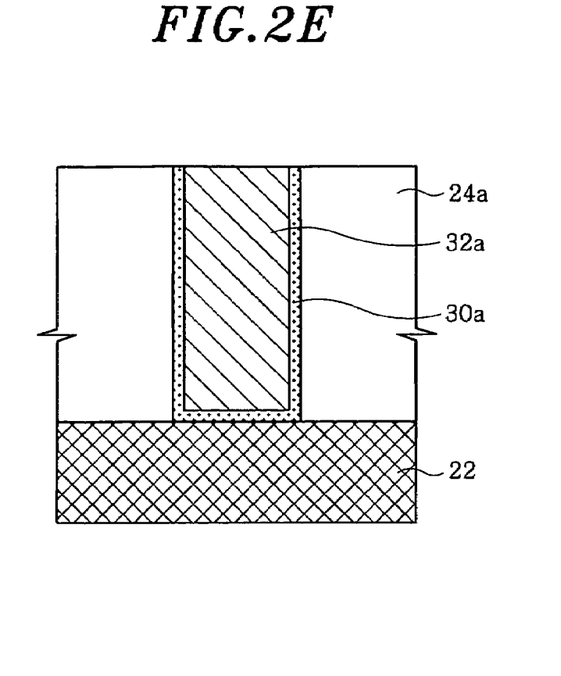

Sequentially, by performing a chemical mechanical polishing (CMP) or an etch-back process to the deposited first barrier metal layer 30 and the coated second metal layer 32, as shown in FIG. 2E, a first barrier metal 30a and a second metal 32a are planarized.

Figure 2F:
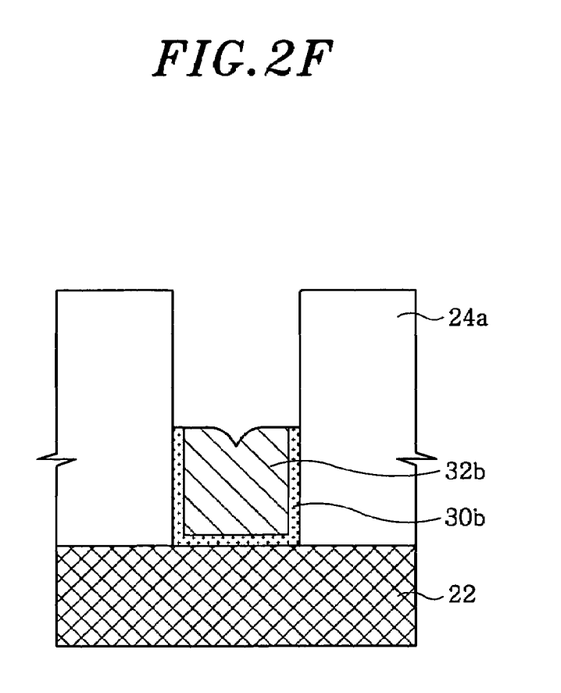

Again, by applying an etch-back process to the first barrier metal 30a and the second metal 32a, as shown in FIG. 2F, the first barrier metal 30a and the second metal 32a are etched by a predetermined depth. In this regard, it is preferable that the second metal is selectively etched so as to have a shape that a central portion of a surface of a second metal pattern 32b is indented as shown in FIG. 2F.

Figure 2G:
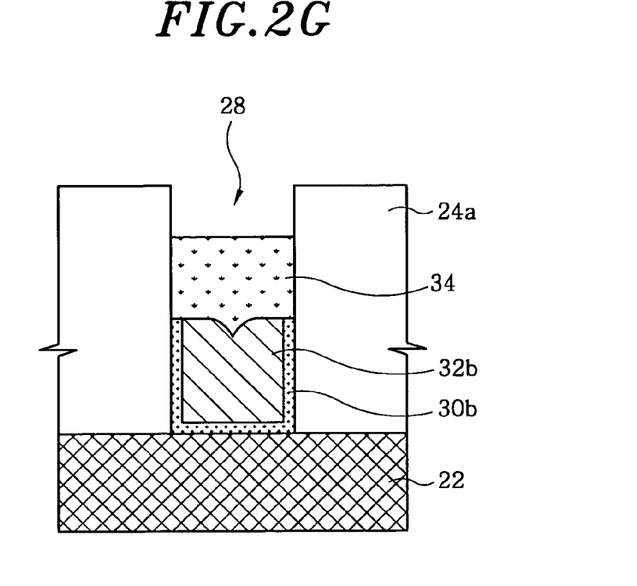

Thereafter, a silicon layer 34 is formed on the first barrier metal pattern 30b and the second metal pattern 32b in the via hole 28, as shown in FIG. 2G. At this time, the silicon layer 34 is formed of amorphous silicon. Further, a top surface of the silicon layer 34 is formed in such a way that its top surface is placed below the top of the interlayer insulating layer pattern 24a. In the preferred embodiment, the silicon layer 34 has a flat surface formed having a thickness enough to cover the indented shape of the second metal pattern 32b.

Figure 2H:
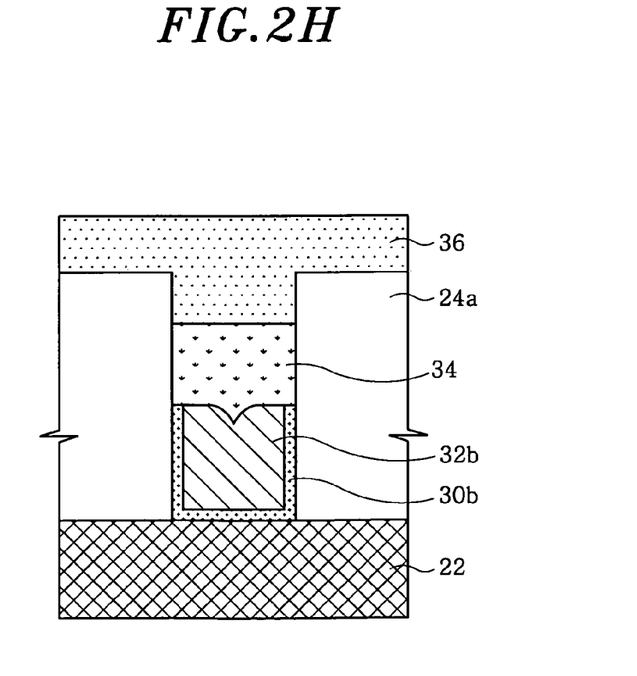

After that, a second barrier metal layer 36 made of titanium is deposited on the top surfaces of the interlayer insulating layer pattern 24a and the silicon layer 34. The second barrier metal layer 36 is then planarized by performing a CMP, as shown in FIG. 2H.

Figure 2I:
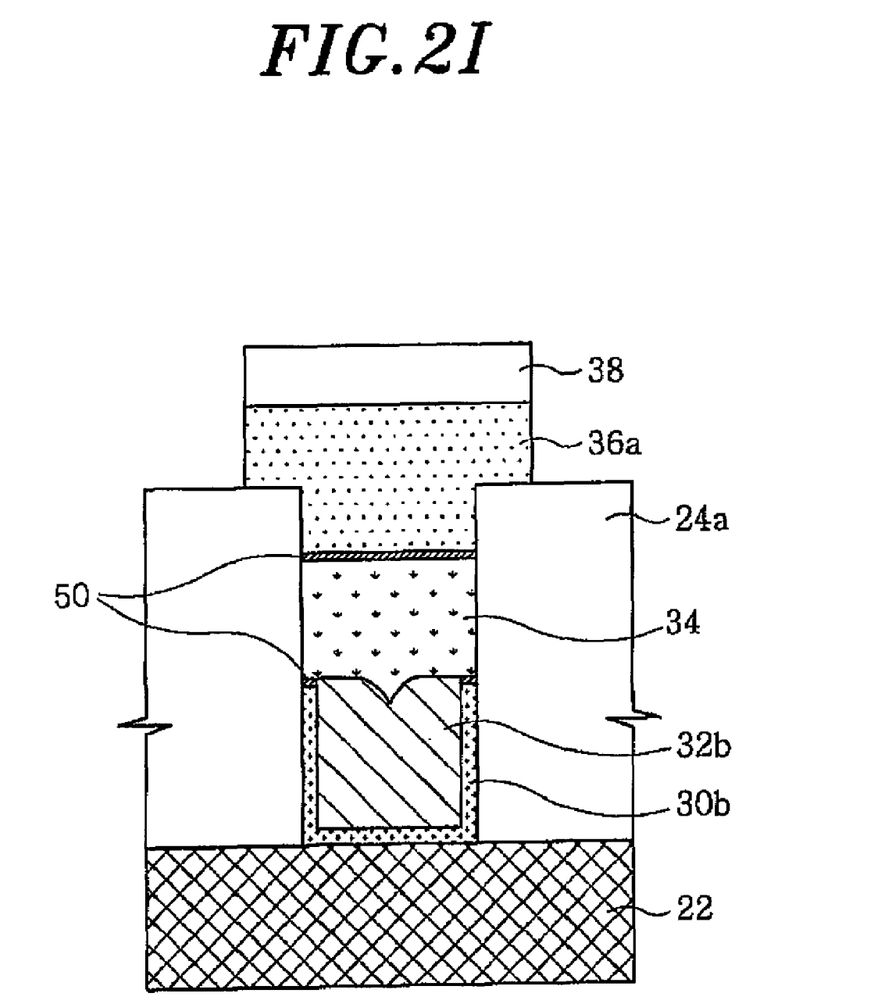

Finally, a third metal layer(not shown) is coated by performing a sputtering process on the second barrier metal layer 36, selectively etching the second barrier metal layer 36 and the third metal layer by using a photoresist layer pattern (not shown) as a mask, as shown in FIG. 2I. Sequentially, the metal wiring of a semiconductor device is formed by forming a second barrier metal pattern 36a and a second metal layer pattern 38 on a cover of the via hole 28, i.e., on the interlayer insulating layer pattern 24a and the silicon layer 34.

Thereafter, if a desired voltage is applied to the semiconductor device manufactured by the above-described method, the first metal layer 22 and the third metal layer pattern 38 are electrically connected because silicide 50 is formed between the first barrier metal pattern 30b and the silicon layer 34 and between the second barrier metal pattern 36a and the silicon layer 34.

It should be understood that those skilled in the art implement the present invention in various other shapes without departing from the technical spirit or necessary characteristics of the invention. In accordance with the embodiment of the present invention, it has been described that the second barrier metal pattern 36a is formed inside of the via hole 28 as well as on the interlayer insulating layer pattern 24a. However, alternatively, in a modified embodiment, by applying a CMP to the second barrier metal layer 36, the second barrier metal 36a can be formed only inside of the via hole 28 by planarizing the second barrier metal layer 36 to the same height as the interlayer insulating layer pattern 24a. Therefore, the third metal layer pattern 38 is directly formed on the interlayer insulating layer pattern 24a.

In accordance with the present invention as described above, by forming an insulating layer inside of a via hole with amorphous silicon, since a current flows when a desired voltage is applied with a program to a portion desired by a client, a semiconductor device can be implemented according to an operational voltage desired by the client or the semiconductor device desired by the client can be supplied without installing more fabrications.

Furthermore, in accordance with the embodiment of the present invention, there is an effect that a contact resistance between an insulating layer and a metal layer can be reduced by enlarging a contact area contacting between the insulating layer and the metal layer by selectively etching a surface of the metal layer in contact with the insulating layer.

While the invention has been shown and described with respect to the preferred embodiments, it will be understood by those skilled in the art that various changes and modifications may be made without departing from the spirit and scope of the invention as defined in the following claims.

What is claimed is:

1. A method of manufacturing a semiconductor device, the method comprising the steps of:
    forming a via hole by selectively etching an interlayer insulating layer formed on a first metal layer;
    sequentially forming a first barrier metal layer and a second metal layer on the interlayer insulating layer formed therein the via hole and performing a planarizing process;
    etching the first barrier metal layer and the second metal layer in the via hole to a predetermined depth together with selectively etching a surface of the second metal layer, simultaneously, thereby obtaining a first barrier metal and a second metal;
    forming a silicon layer on the first barrier metal and the second metal to a predetermined height, wherein the silicon layer is formed of amorphous silicon;
    forming a second barrier metal layer on the interlayer insulating layer including the via hole;
    forming a third metal layer on the second barrier metal layer; and
    forming a second barrier metal pattern and a third metal layer pattern by patterning the second barrier metal layer and the third metal layer.

2. The method of claim 1, wherein the second metal is etched by an etch back process in such a way that a central portion of a surface of the second metal is depressed.

3. The method of claim 1, wherein, in the silicon layer formation step, the silicon layer is stacked until a surface of the silicon layer becomes flat.

4. The method of claim 1, wherein the second barrier metal pattern is formed to cover the via hole.

5. The method of claim 1, wherein the first barrier metal and the second barrier metal are made of titanium.

6. The method of claim 1, wherein before the third metal layer is formed, the method includes the step of:
   planarizing the second barrier metal layer using a chemical mechanical polishing process.

7. A method for manufacturing a semiconductor device, the method comprising the steps of:
   forming a via hole by selectively etching an interlayer insulating layer formed on a first metal layer;
   sequentially forming a first barrier metal layer and a second metal layer on the interlayer insulating layer formed therein the via hole and performing a planarizing process;
   etching the first barrier metal layer and the second metal layer in the via hole to a predetermined depth together with selectively etching a surface of the second metal layer, simultaneously, thereby obtaining a first barrier metal and a second metal;
   forming a silicon layer on the first barrier metal and the second metal to a predetermined height, wherein the silicon layer is formed of amorphous silicon;
   forming a second barrier metal layer on the interlayer insulating layer including the via hole;
   forming a third metal layer on the second barrier metal layer; and
   forming a second barrier metal pattern and a third metal layer pattern by patterning the second barrier metal layer and the third metal layer,
   wherein silicide is formed between the first barrier metal layer and the silicon layer and between the second barrier metal pattern and the silicon layer by applying a voltage to the semiconductor device.

* * * * *